(12) United States Patent
Yang

(10) Patent No.: US 9,287,350 B2
(45) Date of Patent: Mar. 15, 2016

(54) METAL-INSULATOR-METAL CAPACITOR

(71) Applicant: TAIWAN SEMICONDUCTOR MANUFACTURING CO., LTD., Hsinchu (TW)

(72) Inventor: Chi-Han Yang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/338,016

(22) Filed: Jul. 22, 2014

(65) Prior Publication Data
US 2016/0027864 A1 Jan. 28, 2016

(51) Int. Cl.
| H01L 23/52 | (2006.01) |
| H01L 27/10 | (2006.01) |
| H01L 27/24 | (2006.01) |
| H01L 49/02 | (2006.01) |
| H01L 27/108 | (2006.01) |
| H01L 23/522 | (2006.01) |
| H01L 27/08 | (2006.01) |

(52) U.S. Cl.
CPC .............. *H01L 28/60* (2013.01); *H01L 27/108* (2013.01); *H01L 23/5223* (2013.01); *H01L 27/0805* (2013.01); *H01L 27/2418* (2013.01); *H01L 28/40* (2013.01)

(58) Field of Classification Search
CPC . H01L 23/5223; H01L 28/40; H01L 27/0805; H01L 27/2418
See application file for complete search history.

(56) References Cited

U.S. PATENT DOCUMENTS

| 5,978,206 | A | * | 11/1999 | Nishimura et al. | ............ 361/303 |
| 6,066,537 | A | * | 5/2000 | Poh | ............... 438/393 |
| 6,365,954 | B1 | * | 4/2002 | Dasgupta | ................. 257/532 |
| 6,479,850 | B2 | * | 11/2002 | Lee | ............ H01L 28/40 257/296 |
| 6,479,899 | B1 | * | 11/2002 | Fukuda et al. | ................. 257/758 |
| 6,646,860 | B2 | * | 11/2003 | Takaramoto | ......... H01L 23/5222 257/E21.008 |
| 6,891,219 | B2 | * | 5/2005 | Allman | .................... H01L 28/55 257/307 |
| 6,982,472 | B2 | * | 1/2006 | Kiyotoshi | ........... H01L 23/5223 257/277 |
| RE39,124 | E | * | 6/2006 | Ehben et al. | ................... 257/532 |
| 7,160,772 | B2 | * | 1/2007 | Coolbaugh | ....... H01L 21/76808 257/E21.008 |
| 7,307,000 | B2 | * | 12/2007 | Choi | .............................. 438/393 |
| 7,335,966 | B2 | * | 2/2008 | Ihme et al. | .................... 257/532 |
| 7,687,867 | B2 | * | 3/2010 | Coolbaugh | ......... H01L 23/5223 257/401 |
| 7,964,470 | B2 | * | 6/2011 | Horng | .................. H01L 23/5223 257/E21.008 |
| 7,972,907 | B2 | * | 7/2011 | Kemerling et al. | ........... 438/128 |
| 7,981,761 | B2 | * | 7/2011 | Imai | .................... H01L 23/5223 257/508 |
| 8,431,970 | B2 | * | 4/2013 | Demircan et al. | ............ 257/232 |
| 8,551,857 | B2 | * | 10/2013 | Imamura | ............. H01L 23/5223 257/532 |
| 8,884,288 | B1 | * | 11/2014 | Li | ........................... H01L 28/40 257/301 |
| 8,933,514 | B2 | * | 1/2015 | Sato | ......................... H01L 28/40 257/360 |
| 2004/0056324 | A1 | * | 3/2004 | Ning | ................... H01L 23/5223 257/528 |
| 2010/0006912 | A1 | * | 1/2010 | Larsen | ............... G11C 11/4125 257/296 |
| 2012/0133022 | A1 | * | 5/2012 | Chinthakindi | .... H01L 21/76819 257/532 |
| 2013/0207120 | A1 | * | 8/2013 | Cheah et al. | .................... 257/76 |
| 2014/0042590 | A1 | * | 2/2014 | Chen | ....................... H01L 28/60 257/532 |
| 2014/0264748 | A1 | * | 9/2014 | Fujiwara | ................. H01L 28/40 257/532 |
| 2015/0318340 | A1 | * | 11/2015 | Dirnecker | ............... H01L 28/20 257/533 |

FOREIGN PATENT DOCUMENTS

KR 20030049000 A * 6/2003

* cited by examiner

*Primary Examiner* — Ida M Soward
(74) *Attorney, Agent, or Firm* — Maschoff Brennan

(57) ABSTRACT

A metal-insulator-metal capacitor includes a bottom metal line and a top metal line disposed above the bottom metal line. An insulating material layer is between the bottom metal line and the top metal line, which the insulating material layer is an inter-metal-dielectric layer.

20 Claims, 9 Drawing Sheets

METAL-INSULATOR-METAL CAPACITOR

BACKGROUND

The semiconductor integrated circuit industry has experienced exponential growth. In the evolution of the semiconductor integrated circuit industry, functional density is generally increasing with reduced geometry size, and smaller and more complex circuits than the previous generation are produced. This scaling down process also increases the processing and manufacturing complexity of integrated circuits. For these advances to be realized, associated developments are required in the processing and manufacturing of the integrated circuits.

In the integrated circuits, capacitors are components used for data storage applications. Various capacitive structures are applied in the integrated circuits. These structures include metal-oxide-semiconductor (MOS) capacitors, p-n junction capacitors and metal-insulator-metal (MIM) capacitors. For some applications, the MIM capacitors provide certain advantages over MOS and p-n junction capacitors because the frequency characteristics of MOS and p-n junction capacitors are restricted as a result of depletion layers that form in the semiconductor electrodes. Also, the MIM capacitors formed in the metal interconnect layers reduces CMOS transistor process integration interactions or complications. Generally, the MIM capacitors exhibit improved frequency and temperature characteristics and a topology of a MIM capacitor simplifying planarization in the manufacturing processes.

With the aforementioned advantages, the MIM capacitors have been widely used in functional circuits such as mixed-signal circuits, analog circuits, radio frequency (RF) circuits, dynamic random access memories (DRAMs), embedded DRAMs and logic operation circuits. Therefore, there are constant needs for a method of forming a MIM capacitor to provide a MIM capacitor with improved reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
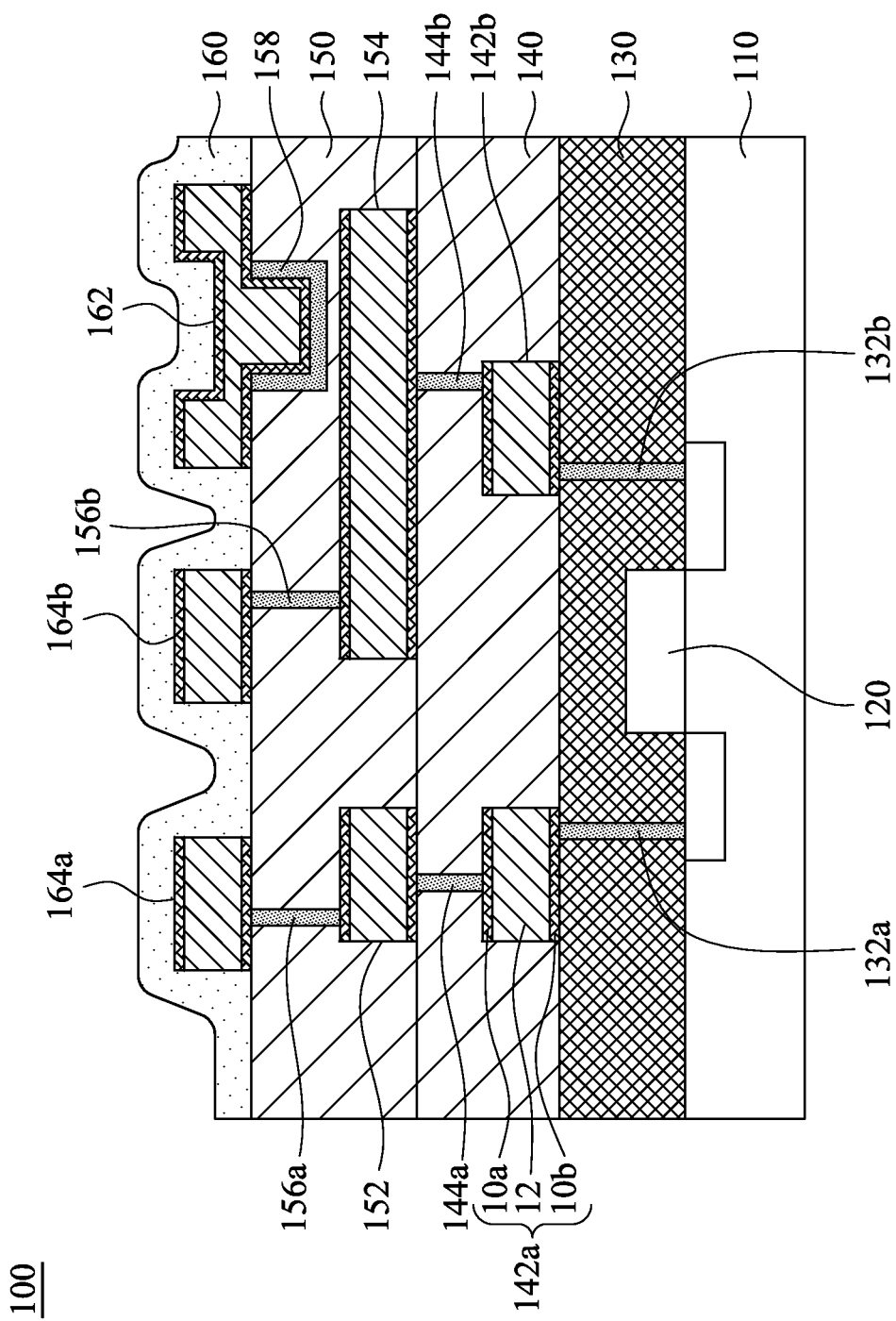
FIG. 1 is a cross-sectional view of an integrated circuit capacitor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) capacitor includes a capacitor bottom metal (CBM), a capacitor top metal (CTM) and an insulating material layer. Generally, a dielectric material, e.g., silicon dioxide or silicon nitride, is deposited on the CBM to form the insulating material layer, and then the CTM is formed on the insulating material layer. A CTM photoresist and a CBM photoresist are applied to pattern the CTM and the CBM, and an inter-metal-dielectric layer covers the patterned CTM and the patterned CBM. On the purpose to operate the MIM capacitor, electrode pads are formed on the inter-metal-dielectric layer and electrically connected to the patterned CTM and the patterned CBM, respectively.

But depositing the dielectric material and applying the CTM photoresist increase complexity of a manufacturing process and also reduce the efficiency. Also, extra costs are required to prepare the dielectric material and the CTM photoresist. As aforementioned, the present disclosure provides a method to manufacture the MIM capacitor without depositing the dielectric material on the CBM and also omitting the CTM photoresist.

According to various embodiments of the present disclosures, a MIM capacitor and a method of manufacturing the MIM capacitor are provided to save the CTM photoresist and the dielectric material. FIG. 1 is a cross-sectional view of an integrated circuit capacitor 100. The integrated circuit capacitor 100 includes a substrate 110 and a semiconductor device 120. An inter-layer-dielectric (ILD) layer 130 is disposed on the substrate 110 to cover the semiconductor device 120. The ILD layer 130 includes first vias 132a and 132b, and the first vias 132a and 132b are electrically connected to the semiconductor device 120. In embodiments, the substrate 100 is made of semiconductor material such as silicon, germanium, silicon germanium, silicon carbide, and those consisting essentially of III-V compound semiconductors (e.g., GaAs).

A first inter-metal-dielectric (IMD) layer 140 is disposed on the ILD layer 130, which the IMD layer 140 includes first metal lines 142a and 142b and second vias 144a and 144b. The first metal lines 142a and 142b are electrically connected to the semiconductor device 120 by the first vias 132a and 132b. Also, the second vias 144a and 144b are electrically connected to the first metal lines 142a and 142b. Above the first IMD layer 140 is a second IMD layer 150, which includes a second metal line 152, a bottom metal line 154 and third vias 156a and 156b. The second metal line 152 and the bottom metal line 154 are electrically connected to the first metal lines 142a and 142b by the second vias 144a and 144b, respectively.

In embodiments, the ILD layer 130 and the IMD layers 140 and 150 are formed of un-doped oxide (USG), fluorinated silicate glass (FSG), B, P silicate glass (BPSG) or low-k dielectric materials. The ILD layer 130 and the IMD layers 140 and 150 isolate adjacent semiconductor devices or metal lines from short circuit.

A top metal line 162 is disposed above the bottom metal line 154. A first portion of the top metal line 162 is buried in the second IMD layer 150, and a second portion of the top metal line 162 is disposed on the second IMD layer 150. The top metal line 162 is not in contact with the bottom metal line 154, an insulating material layer is between the bottom metal line 154 and the top metal line 162. Therefore, a MIM capacitor is formed, where the insulating material layer is the second IMD layer 150. The second IMD layer 150 between the bottom metal line 154 and the top metal line 162 acts as the insulating material layer, and thus a process of depositing the dielectric material on the bottom metal line 154 could be omitted. In embodiments, a thickness of the second IMD layer 150 between the top metal line 162 and the bottom metal line 154 is in a range from about 360 angstroms to about 370 angstroms.

In embodiments, the second IMD layer 150 also includes a conductive layer 158. The conductive layer 158 surrounds the first portion of the top metal line 162 and being electrically connected to the top metal line 162. The conductive layer 158 is formed of copper or tungsten, which could enhance conductivity of the top metal line 162.

The integrated circuit capacitor 100 also includes third metal lines 164a and 164b. The third metal lines 164a and 164b are disposed on the second IMD layer 150 and electrically connected to the second metal line 152 and the bottom metal line 154 by the third vias 156a and 156b, respectively. The third metal lines 164a and 164b are topmost metal lines, which are used as electrode pads. With connecting the electrode pads to external devices, the integrated circuit capacitor 100 could be operated. It should be noticed that no electrode pad is connected to the top metal line 162. Since the second portion of the top metal line 162 is disposed on the second IMD layer 150, the top metal line 162 is the topmost metal line and being used as the electrode pad simultaneously. Thus, with connecting the top metal line 162 and the third metal line 164b to the external devices, the MIM capacitor could be operated.

In embodiments, the first metal lines 142a and 142b, the second metal line 152, the third metal lines 164a and 164b, the top metal line 162 and the bottom metal line 154 include two diffusion barrier films 10a and 10b, and a metal material 12 is disposed between the two diffusion barrier films 10a and 10b. The metal material 12 is copper, aluminum, or an alloy of copper and aluminum. The diffusion barrier films 10a and 10b prevent or retard inter-diffusion of the two adjacent metal materials 12, which the diffusion barrier films 10a and 10b are formed of titanium nitride, tungsten nitride, titanium tungsten nitride, or tantalum nitride.

In embodiments, the first vias 132a and 132b, the second vias 144a and 144b, and the third vias 156a and 156b are formed of copper or tungsten.

A passivation layer 160 is disposed on the second IMD layer 150 and covers the third metal lines 164a and 164b and the top metal line 162. The passivation layer 160 protects the topmost metal lines from mechanical damage, for example, particles, scratch, contamination, or other chemical corrosion. In embodiments, the passivation layer 160 is formed of polyimide, silicon oxide, silicon nitride, or combination thereof.

Figure 2:
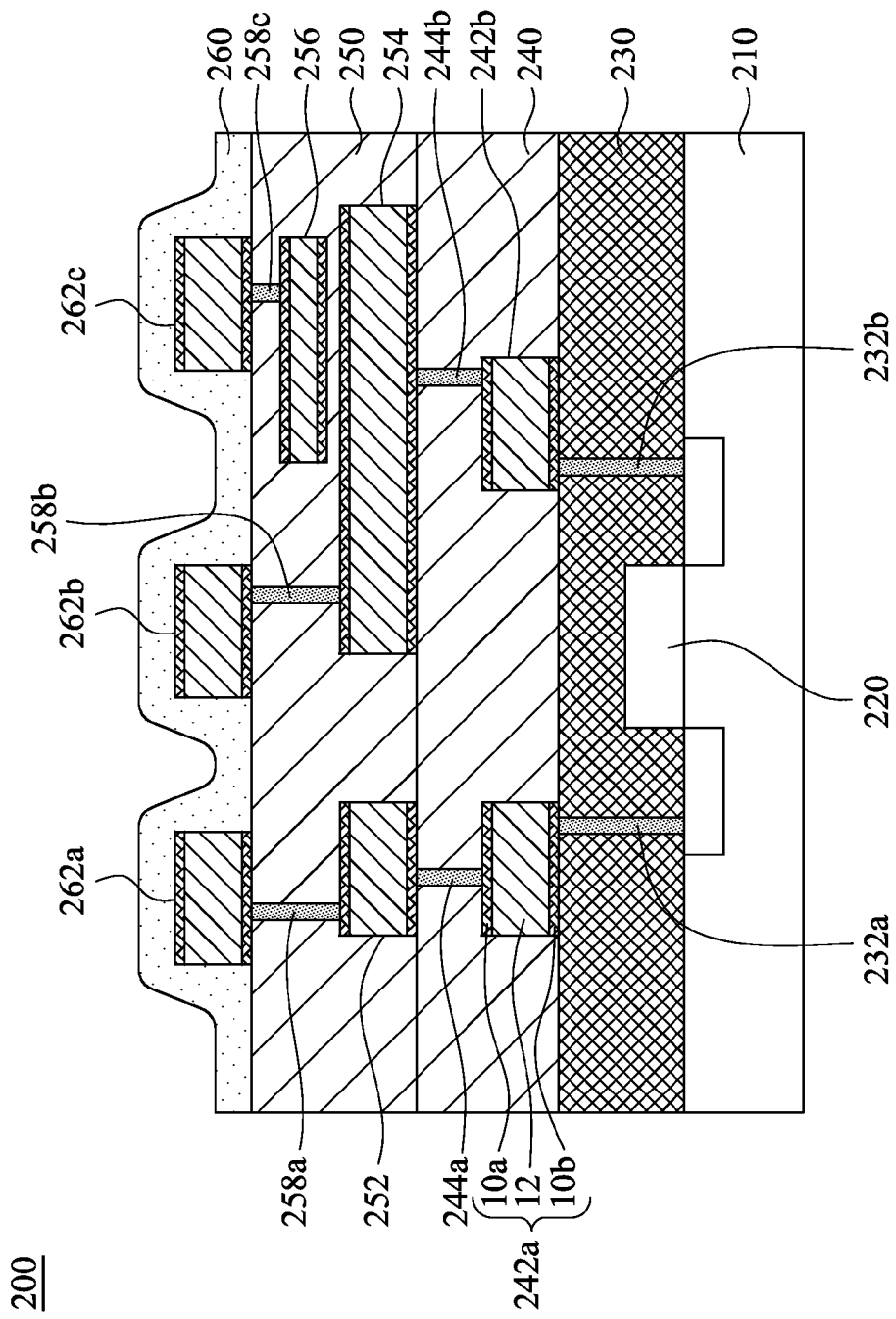
FIG. 2 is a cross-sectional view of an integrated circuit capacitor, in accordance with various embodiments.

FIG. 2 is a cross-sectional view of an integrated circuit capacitor 200 according to various embodiments of the present disclosure. The integrated circuit capacitor 200 includes a substrate 210 and a semiconductor device 220. An ILD layer 230 is disposed on the substrate 210 to cover the semiconductor device 220. The ILD layer 230 includes first vias 232a and 232b, which the first vias 232a and 232b are electrically connected to the semiconductor device 220. In embodiments, the substrate 200 is made of semiconductor material such as silicon, germanium, silicon germanium, silicon carbide, and those consisting essentially of III-V compound semiconductors (e.g., GaAs).

A first IMD layer 240 is disposed on the ILD layer 230, which the IMD layer 240 includes first metal lines 242a and 242b and second vias 244a and 244b. The first metal line 242a and 242b are electrically connected to the semiconductor device 220 by the first vias 232a and 232b. On the other hand, the second vias 244a and 244b are also electrically connected to the first metal lines 242a and 242b. Above the first IMD layer 240 is a second IMD layer 250, which includes a second metal line 252, a bottom metal line 254, a top metal line 256, and third vias 258a, 258b and 258c. The second metal line 252 and the bottom metal line 254 are electrically connected to the first metal lines 242a and 242b by the second vias 244a and 244b, respectively.

In embodiments, the ILD layer 230 and the IMD layers 240 and 250 are formed of un-doped oxide (USG), fluorinated silicate glass (FSG), B, P silicate glass (BPSG) or low-k dielectric materials. The ILD layer 230 and the IMD layers 240 and 250 isolate adjacent semiconductor devices or metal lines from short circuit.

The top metal line 256 is disposed above the bottom metal line 254, and the second IMD layer 250 covers the top metal line 256 and the bottom metal line 254. The top metal line 256 is not in contact with the bottom metal line 254, an insulating material layer is between the bottom metal line 254 and the top metal line 256. Therefore, the MIM capacitor is formed, where the insulating material layer is the second IMD layer 250. The second IMD layer 250 between the bottom metal line 254 and the top metal line 256 acts as the insulating material layer, and thus the process of depositing the dielectric material on the bottom metal line 254 could be omitted. In embodiments, a thickness of the second IMD layer 250 between the top metal line 256 and the bottom metal line 154 is in a range from about 360 angstroms to about 370 angstroms.

The integrated circuit capacitor 200 also includes third metal lines 262a, 262b and 262c. The third metal lines 262a, 262b and 262c are disposed on the second IMD layer 250. The third metal line 262a is electrically connected to the second metal line 252 by the third via 258a, and the third metal line 262b and 262c are electrically connected to the bottom metal line 254 and the top metal line 256 by the third vias 258b and 258c, respectively. The third metal lines 258ba and 258c are the topmost metal lines, which are used as the electrode pads for connecting the external devices. Thus, with connecting the third metal lines 258b and 258c to the external devices, the MIM capacitor could be operated.

In embodiments, The first metal lines 242a and 242b, the second metal line 252, the third metal lines 262a, 262b and 262c, the top metal line 256 and the bottom metal line 254 include two diffusion barrier films 10a and 10b, and a metal material 12 is disposed between the two diffusion barrier films 10a and 10b. The metal material 12 is copper, aluminum, or an alloy of copper and aluminum. The diffusion barrier films 10a and 10b prevent or retard inter-diffusion of the two adjacent metal materials 12, which the diffusion barrier films 10a and 10b are formed of titanium nitride, tungsten nitride, titanium tungsten nitride, or tantalum nitride.

In embodiments, the first vias 232a and 232b, the second vias 244a and 244b, and the third vias 258a, 258b and 258c are formed of copper or tungsten.

A passivation layer 260 is disposed on the second IMD layer 250 and covers the third metal lines 262a, 262b and 262c. The passivation layer 260 protects the topmost metal lines from mechanical damage, for example, particles, scratch, or contamination and other chemical corrosion. In embodiments, the passivation layer 260 is formed of polyimide, silicon oxide, silicon nitride, or combination thereof.

FIGS. 3A-3F are cross-sectional views at various stages of manufacturing the integrated circuit capacitor 100 according to various embodiments of the present disclosure. To clarify description and avoid repetition, like numerals and letters used to describe the integrated circuit capacitor 100 above are used for the various elements in the coming figures. Also, reference numerals described previously may not be described again in detail herein.

Figure 3A:
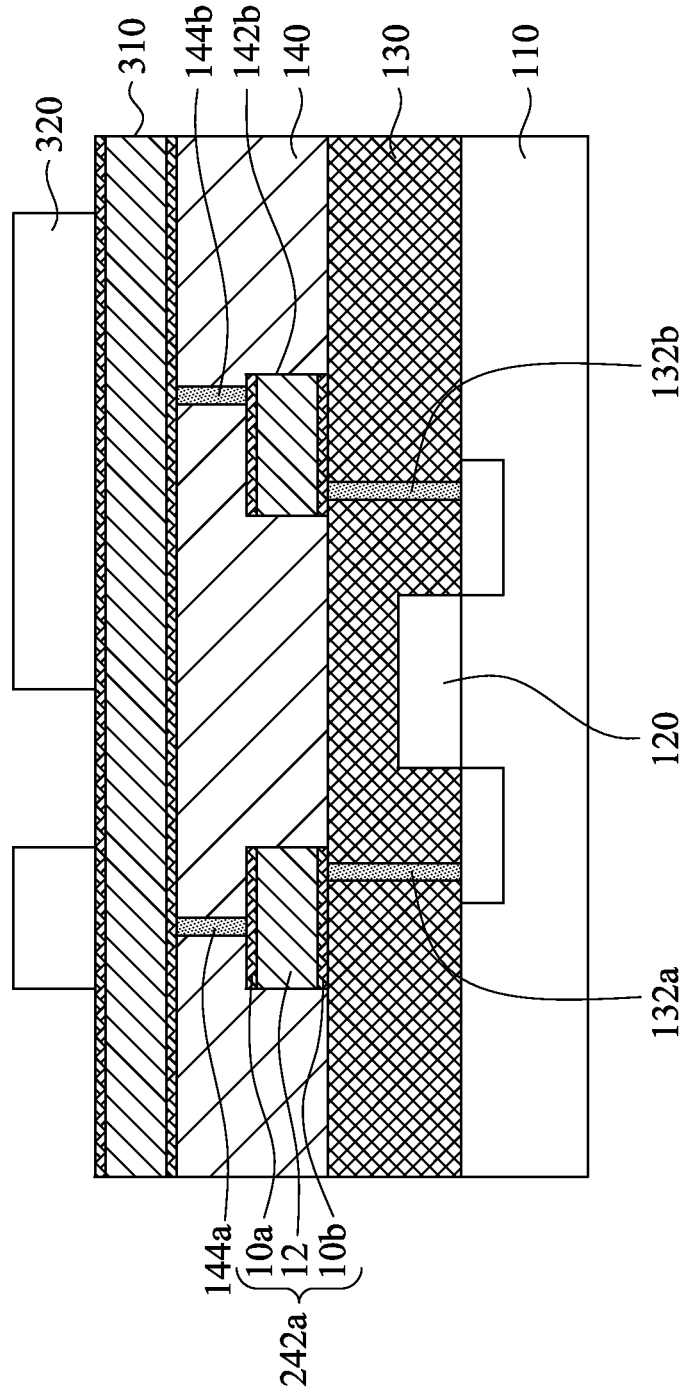
FIGS. 3A-3G are cross-sectional views at various stages of manufacturing an integrated circuit capacitor, in accordance with various embodiments.

As shown in FIG. 3A, the substrate 110, the semiconductor device 120, the ILD layer 130 and the first IMD layer 140 are provided. The process of forming these elements is well known, so the detailed description is not repeated here. A first metal layer 310 is formed on the first IMD layer 140 by sputtering, and a first photoresist layer 320 is formed on the first metal layer 310. In embodiments, the photoresist layer 320 is formed according to the predefined pattern of a first photomask.

Figure 3B:
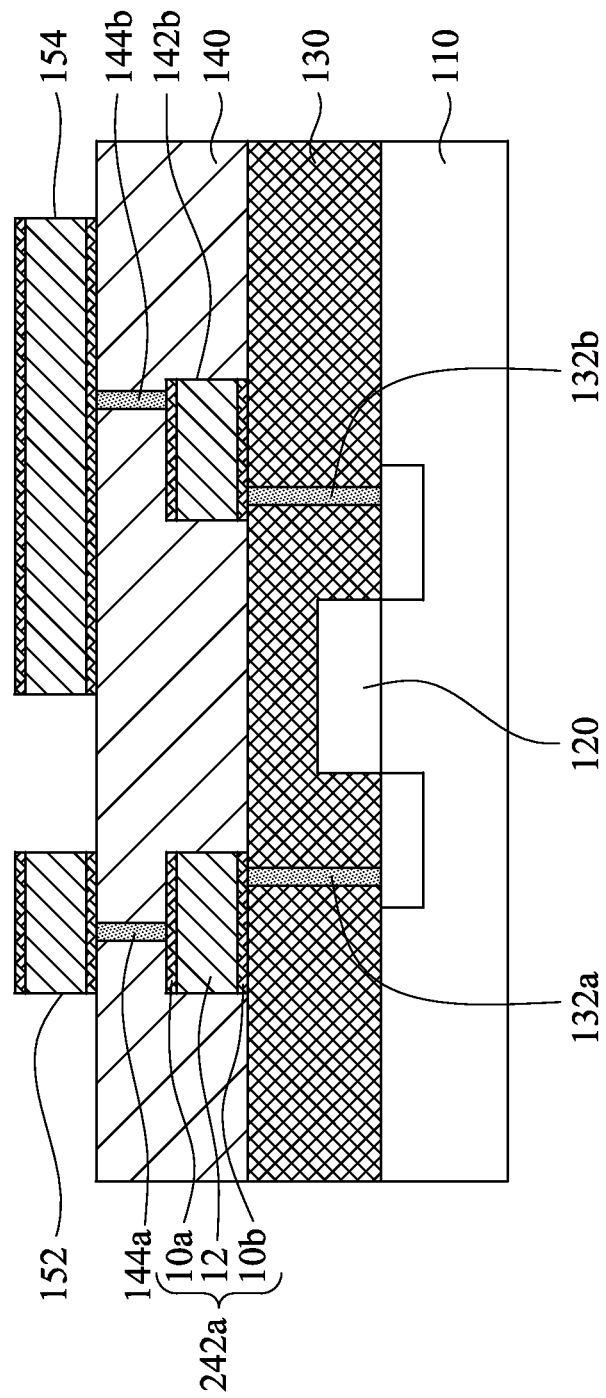

Continuing in FIG. 3B, the first metal layer 310 is etched to form the bottom metal line 154 and the second metal line 152. Since the first photoresist layer 320 is applied to pattern the first metal layer 310 and forms the bottom metal line 154, which the first photoresist layer 320 is also known as a CBM photoresist. After the bottom metal line 154 and the second metal line 152 are formed, the first photoresist layer 320 will be stripped. In embodiments, a dry etching process is applied to etch the first metal layer 310.

Figure 3C:
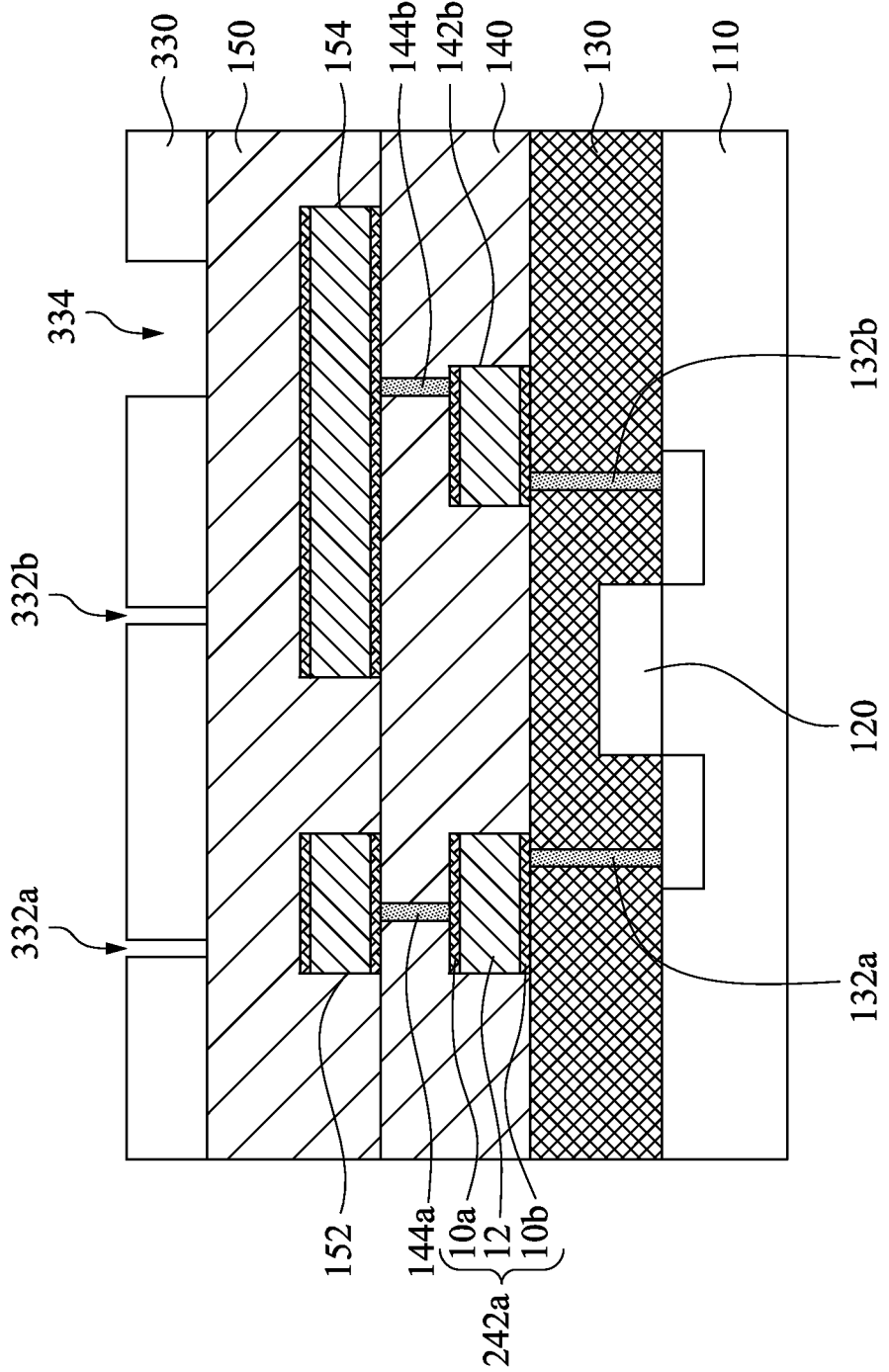

Referring now to FIG. 3C, the second IMD layer 150 is formed to cover the bottom metal line 154 and the second metal line 152. The second IMD layer 150 is deposited using conventional processes, for example, chemical vapor deposition (CVD) or plasma-enhanced chemical vapor deposition (PECVD). Oxides such as un-doped oxide (USG), fluorinated silicate glass (FSG), B, P silicate glass (BPSG) or low-k dielectric materials are deposited on the first IMD layer 140 to form the second IMD layer 150. In embodiments, after forming the second IMD layer 150, a chemical mechanical polish (CMP) process is applied to planarize the second IMD layer 150.

After planarizing the second IMD layer 150, a second photoresist layer 330 is formed on the second IMD layer 150. The second photoresist layer 330 has a first opening 334 and second opening 332a and 332b, which the first opening 334 is wider than the second openings 332a and 332b. In embodiments, the photoresist layer 330 is formed according to the predefined pattern of a second photomask.

Figure 3D:
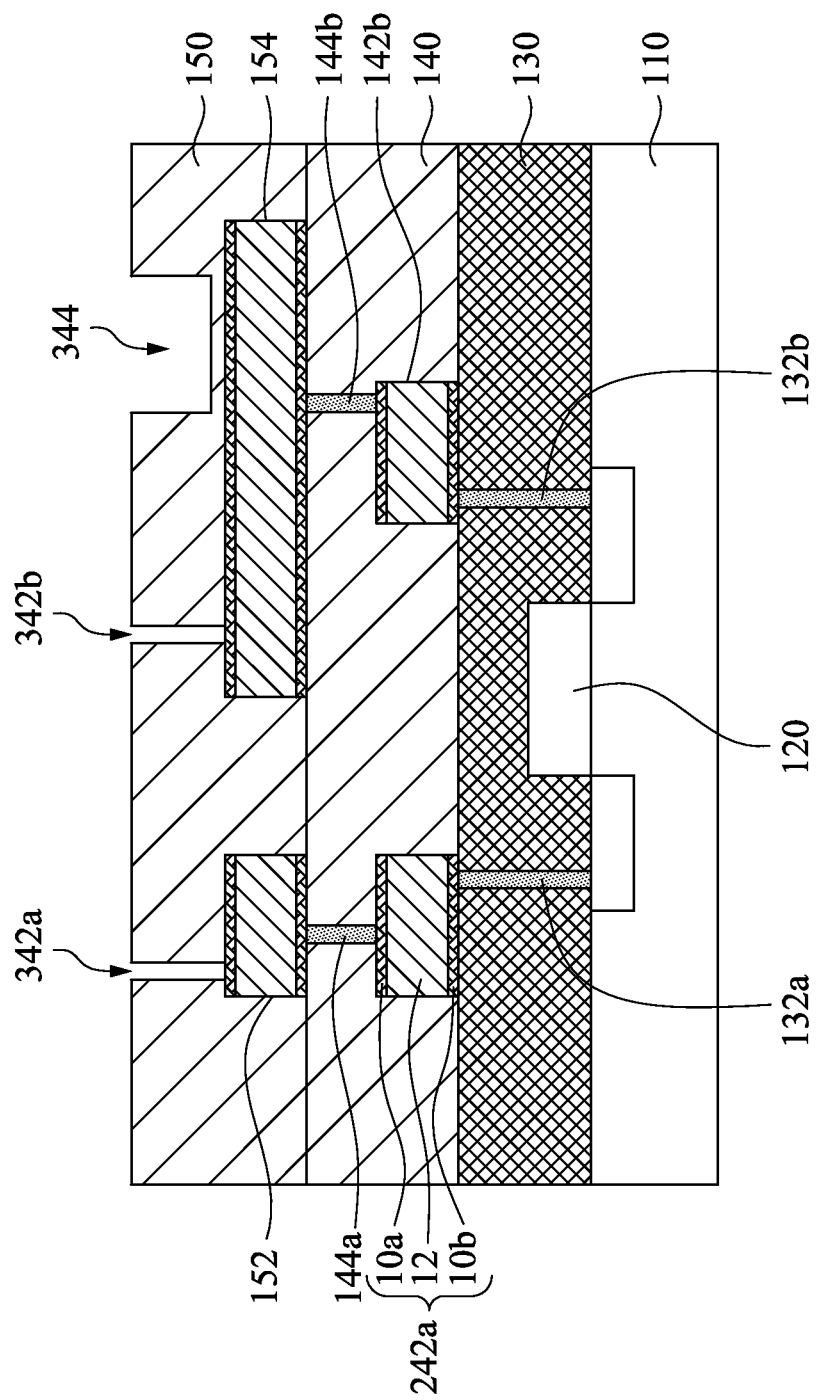

Continuing in FIG. 3D, the second IMD layer 150 is etched to form a first hole 344 and second holes 342a and 342b. Etching the IMD layer 150 through the second openings 332a and 332b forms the second holes 342a and 342b. The second holes 342a and 342b further expose the second metal line 152 and the bottom metal line 154, respectively. Besides, while etching the IMD layer 150 through the second openings 332a and 332b, the IMD layer 150 is being etched through the first opening 344 simultaneously to form the first hole 344. Owing to a loading effect, etching rate depends on the surface area of the material to be etched. Because the first opening 334 is wider than the second openings 332a and 332b, etching rate through the first opening 334 is slower than etching rate through the second openings 332a and 332b. With the slower etching rate, the first hole 344 is wider but shallower than the second holes 342a and 342b. Since the second holes 342a and 342b expose the second metal line 152 and the bottom metal line 154, the bottom metal line 154 is not exposed by the shallower first hole 344. A thickness of the second IMD layer 150 will be remained on the bottom metal line 154 and acts as the insulating material layer. After forming the first hole 344 and the second holes 342a and 342b, the second photoresist layer 330 will be stripped.

Figure 3E:
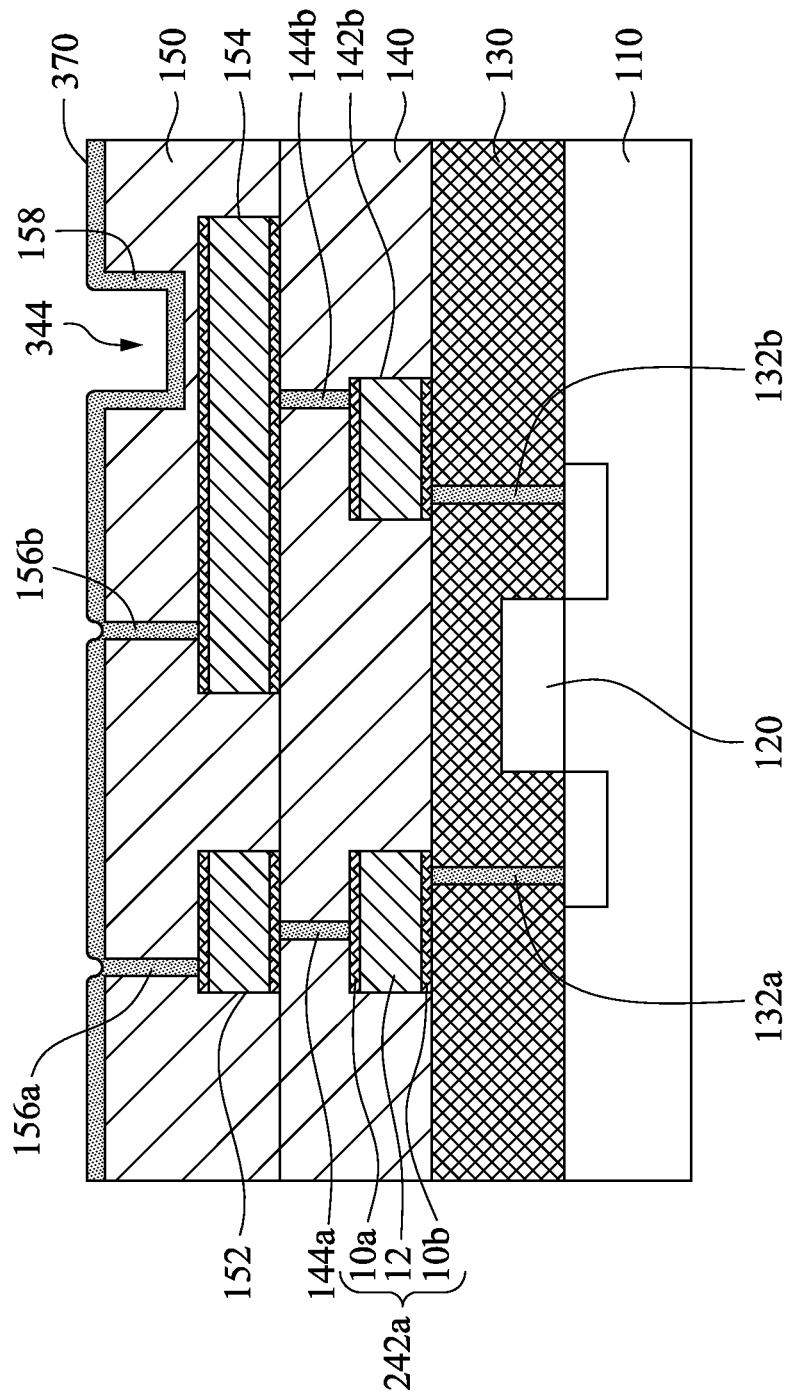

Referring now to FIG. 3E, the second holes 342a and 342b are filled with the conductive material. The conductive material, e.g., copper or tungsten, is deposited to fill the small holes 342a and 342b by CVD or PECVD process, and the third vias 156a and 156b are formed. At the same time, the conductive material also deposits on sidewalls and a bottom of the first hole 344 to form the conductive layer 158. After depositing the conductive material, a conductive material layer 370 will remain on the second IMD layer 150.

Figure 3F:
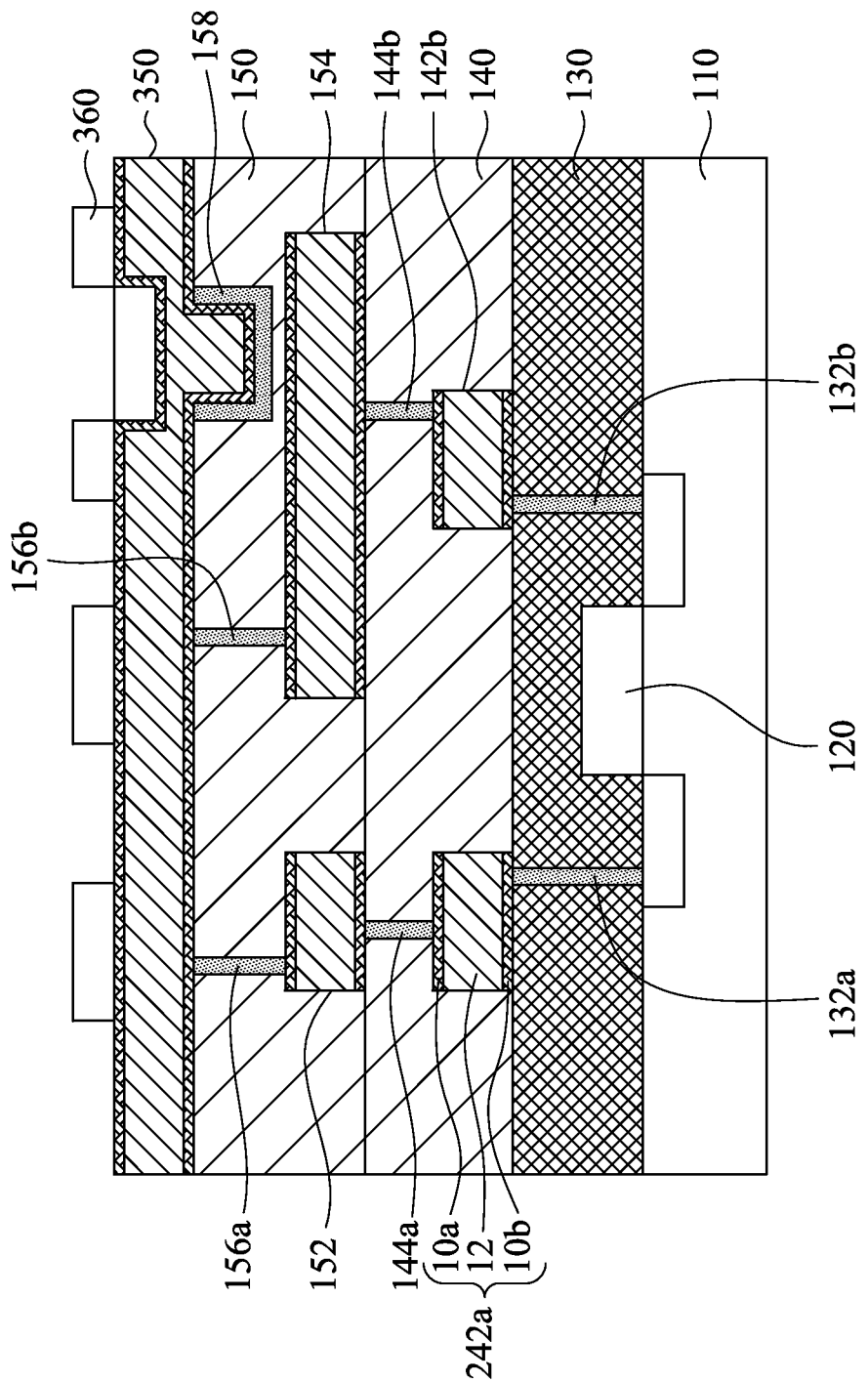

Continuing to FIG. 3F, the conductive material layer 370 is removed by the CMP process, and a second metal layer 350 is formed on the second IMD layer 150 by sputtering. Further, a third photoresist layer 360 is applied on the third metal layer 350 to pattern the third metal layer 350. In embodiments, the photoresist layer 350 is formed according to the predefined pattern of a third photomask.

In embodiments, the first metal layer 310 and the second metal layer 350 are formed by sequentially sputtering a lower diffusion barrier film 10a, the metal material 12 and an upper diffusion barrier film 10b. The metal material 12 is copper, aluminum, or an alloy of copper and aluminum. The lower diffusion barrier film 10a and the upper diffusion barrier film 10b prevent or retard the inter-diffusion of the two adjacent metal materials 12, which the diffusion barrier films 10a and 10b are formed of titanium nitride, tungsten nitride, titanium tungsten nitride, or tantalum nitride.

Figure 3G:
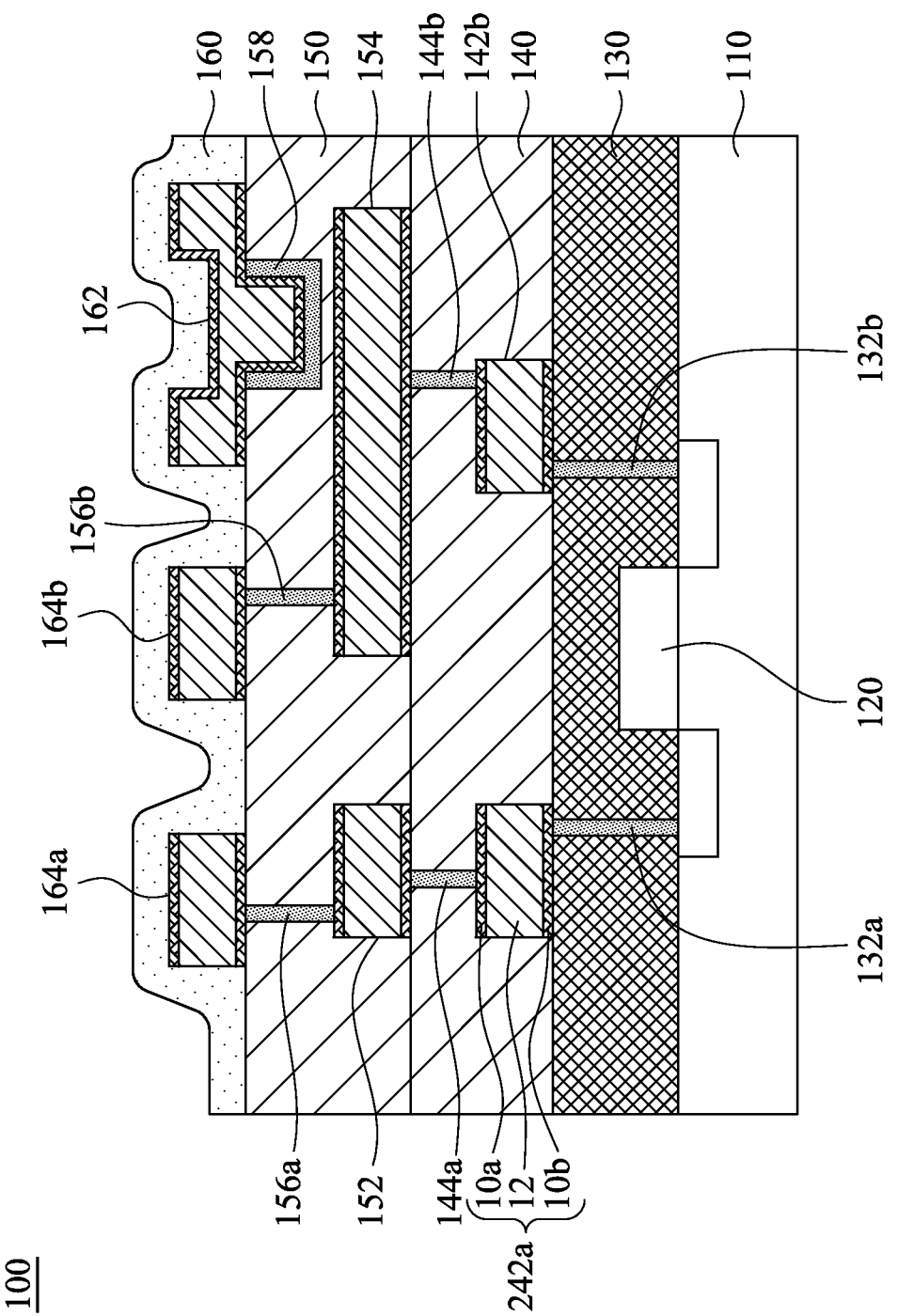

Continuing in FIG. 3G, the second metal layer 350 is etched to form the third metal lines 164a and 164b and the top metal line 162. Further, the third photoresist layer 360 is stripped, and then the passivation layer 160 is formed on the second IMD layer 150. The second metal layer 350 is etched through the third photoresist layer 360, and the third metal lines 164a and 164b and the top metal line 162 are formed simultaneously. The third metal lines 164a and 164b are on the third vias 156a and 156b, and thus the third metal lines 164a and 164b could be electrically connected to the second metal line 152 and the bottom metal line 154, respectively. On the other hand, the conductive layer 158 surrounds the first portion of the top metal line 162 and being electrically connected to the top metal line 162. The conductive layer 158 is formed of copper or tungsten, which could enhance conductivity of the top metal line 162. In embodiments, a dry etching process is applied to etch the second metal layer 350.

Besides, the top metal line 162 is in the first hole 344. The top metal line 162, the bottom metal line 154 and the second IMD layer 150 between the bottom metal line 162 and the top metal line 154 is the MIM capacitor. Because the top metal line 162 could be formed together with the third metal lines 164a and 164b, a CTM photoresist is not required anymore. Besides, the second IMD layer 150 between the bottom metal line 154 and the top metal line 162 acts as the insulating material layer, the process of depositing the dielectric material could be omitted, too.

After etching the second metal layer 350, the third photoresist layer 360 is stripped, and the passivation layer 160 is formed on the second IMD layer 150. Material like polyimide, silicon oxide, or silicon nitride is deposited on the second IMD layer 150 to form a passivation layer 160 by the CVD or the PECVD. The passivation layer 160 covers the third metal lines 164a and 164b and the top metal line 162 to protect them from mechanical damage, for example, particles, scratch, contamination, or other chemical corrosion.

In embodiments, a capacitance of the MIM capacitor is calculated by the following formula:

$$C = \varepsilon_T \varepsilon_0 \frac{A}{d}$$

C is the capacitance, A is an overlapped area of the bottom metal line 154 and the top metal line 162, $\varepsilon_T$ is a dielectric constant of the second IMD layer 150 between the bottom metal line 154 and the top metal line 162, $\varepsilon_0$ is the electric constant and d is the thickness of the second IMD layer 150 between the bottom metal line 154 and the top metal line 162. As shown in the formula, the capacitance will be changed with the thickness. On the purpose to obtain desired capacitance, the loading effect could be applied to adjust the thickness. For example, when etching through a wider first opening 334, a thicker second IMD layer 150 will be remained on the bottom metal line 154. On the other hand, when etching through a narrower first opening 334, a thinner second IMD layer 150 will be remained on the bottom metal line 154. Therefore, the capacitance of the MIM capacitor is controlled by a width of the first opening 334.

The embodiments of the present disclosure discussed above have advantages over existing structures and methods, and the advantages are summarized below. In various embodiments, etching through a big opening will remain the inter-metal-dielectric layer on the CBM, which the inter-metal-dielectric layer acts as the insulating material layer of the MIM capacitor. Therefore, depositing the dielectric material on the CBM to form the insulating material layer is not necessary anymore. The inter-metal-dielectric layer used for isolating adjacent metal lines could directly act as the insulating material layer. Besides, the capacitance of the MIM capacitor is controlled by the width of the big opening. Owing to the loading effect, a wider big opening will form a thicker inter-metal-dielectric layer on the CBM.

In various embodiments, the inter-metal-dielectric layer does not cover the CTM. Because the CTM is the topmost metal line, it could be formed together with the electrode pads. Therefore, the CTM photoresist could be saved when forming the MIM capacitor. Summarize above points, the MIM capacitor and the manufacturing method disclosed here without using the dielectric material and the CTM photoresist, and thus reduces complexity of the manufacturing process and enhances the efficiency.

In accordance with some embodiments, the present disclosure discloses a metal-insulator-metal capacitor. The metal-insulator-metal capacitor includes a bottom metal line and a top metal line disposed above the bottom metal line. An insulating material layer is between the bottom metal line and the top metal line, which the insulating material layer is an inter-metal-dielectric layer.

In accordance with some embodiments, the present disclosure discloses a method of forming a metal-insulator-metal capacitor. The method starts with providing a bottom metal line, and the bottom metal line is covered with an inter-metal-dielectric layer. The inter-metal-dielectric layer is etched to form an insulating material layer on the bottom metal line, which the insulating material layer is the inter-metal-dielectric layer. At the same time, a first hole is formed to expose the insulating material layer, and a top metal line is formed in the first hole.

In accordance with some embodiments, the present disclosure discloses a metal-insulator-metal capacitor. A metal-insulator-metal capacitor includes a bottom metal line and a top metal line. An insulating material layer is between the bottom metal line and the top metal line, and an inter-metal-dielectric layer covers the bottom metal line, where the insulating material layer being the inter-metal-dielectric layer. A metal line is disposed on the inter-metal-dielectric layer, which the metal line is electrically connected to the bottom metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal capacitor comprising:
   a bottom metal line;
   a top metal line; and
   an insulating material layer disposed between the bottom metal line and the top metal line, the insulating material layer being an inter-metal-dielectric layer, wherein the top metal line comprises a first portion and a second portion, the first portion being buried in the inter-metal-dielectric layer, and the second portion being on the inter-metal-dielectric layer.

2. The metal-insulator-metal capacitor of claim 1, wherein the inter-metal-dielectric layer is formed of undoped silicate glass (USG), fluorinated silicate glass (FSG), B, P doped silicate glass (BPSG), or low-k dielectric materials.

3. The metal-insulator-metal capacitor of claim 1, wherein the bottom metal line and the top metal line comprise two diffusion barrier films and a metal material disposed between the two diffusion barrier films.

4. The metal-insulator-metal capacitor of claim 3, wherein the metal material is copper, aluminum, or an alloy of copper and aluminum.

5. The metal-insulator-metal capacitor of claim 3, wherein the two diffusion barrier films are formed of titanium nitride, tungsten nitride, titanium tungsten nitride, or tantalum nitride.

6. The metal-insulator-metal capacitor of claim 1, wherein the bottom metal line is buried in the inter-metal-dielectric layer, and a portion of the inter-metal-dielectric layer being between the top metal line and the bottom metal line.

7. The metal-insulator-metal capacitor of claim 1, further comprising a metal line disposed on the inter-metal-dielectric layer and electrically connected to the bottom metal line.

8. The metal-insulator-metal capacitor of claim 7, wherein the metal line is electrically connected to the bottom metal line by a via.

9. The metal-insulator-metal capacitor of claim 7, further comprising a passivation layer covering the second portion of the top metal line and the metal line.

10. The metal-insulator-metal capacitor of claim 9, wherein the passivation layer comprises polyimide, silicon oxide, silicon nitride, or combination thereof.

11. The metal-insulator-metal capacitor of claim 1, further comprising a conductive layer surrounding the first portion of the top metal line.

12. The metal-insulator-metal capacitor of claim 11, wherein the conductive layer comprises copper and tungsten.

13. A metal-insulator-metal capacitor, comprising:
a bottom metal line;
a top metal line comprising a first portion and a second portion;
an inter-metal-dielectric layer covering the bottom metal line, and a portion of the inter-metal-dielectric layer being between the bottom metal line and the top metal line to act as an insulating material layer, wherein the first portion of the top metal line is buried in the inter-metal-dielectric layer, and the second portion of the top metal line is on the inter-metal-dielectric layer; and
a metal line disposed on the inter-metal-dielectric layer and electrically connected to the bottom metal line.

14. The metal-insulator-metal capacitor of claim 13, wherein the inter-metal-dielectric layer is formed of undoped silicate glass (USG), fluorinated silicate glass (FSG), B, P doped silicate glass (BPSG), or low-k dielectric materials.

15. The metal-insulator-metal capacitor of claim 13, wherein each of the bottom metal line, the top metal line and the metal line comprises two diffusion barrier films and a metal material disposed between the two diffusion barrier films.

16. The metal-insulator-metal capacitor of claim 15, wherein the metal material is copper, aluminum, or an alloy of copper and aluminum.

17. The metal-insulator-metal capacitor of claim 15, wherein the two diffusion barrier films are formed of titanium nitride, tungsten nitride, titanium tungsten nitride, or tantalum nitride.

18. The metal-insulator-metal capacitor of claim 13, further comprising a passivation layer covering the metal line and the second portion of the top metal line.

19. The metal-insulator-metal capacitor of claim 13, further comprising a conductive layer surrounding the first portion of the top metal line.

20. The metal-insulator-metal capacitor of claim 19, wherein the conductive layer comprises copper and tungsten.

* * * * *